United States Patent
Lee

(10) Patent No.: US 7,889,493 B2
(45) Date of Patent: Feb. 15, 2011

(54) COVER STRUCTURE AND ELECTRONIC DEVICE USING THE SAME

(75) Inventor: Tsung-Han Lee, Taipei Hsien (TW)

(73) Assignee: FIH (Hong Kong) Limited, Kowloon (HK)

(*) Notice: Subject to any disclaimer, the term of this patent is extended or adjusted under 35 U.S.C. 154(b) by 37 days.

(21) Appl. No.: 12/422,356

(22) Filed: Apr. 13, 2009

(65) Prior Publication Data

US 2010/0066219 A1    Mar. 18, 2010

(30) Foreign Application Priority Data

Sep. 12, 2008   (CN) .................... 2008 1 0304486

(51) Int. Cl.
*H05K 5/00* (2006.01)
*H05K 7/00* (2006.01)

(52) U.S. Cl. .................. 361/679.4; 361/679.45

(58) Field of Classification Search ............ 361/679.4, 361/679.45
See application file for complete search history.

(56) References Cited

U.S. PATENT DOCUMENTS 6,652,297 B1 * 11/2003 Zhang et al. ................ 439/136

* cited by examiner

*Primary Examiner*—Jayprakash N Gandhi
*Assistant Examiner*—Anthony M Haughton
(74) *Attorney, Agent, or Firm*—Steven M. Reiss

(57) ABSTRACT

A cover structure comprises: a substrate defined a sliding slot and an opening adjacent to the sliding slot; a covering board defined a receiving portion; an alignment plate defined a salient point, and an aperture aligned with the opening; the alignment plate is fixed on the substrate, the covering board is slidably positioned in the sliding slot and between the substrate and the alignment plate, and the salient point is received in the receiving portion to lock the covering board.

12 Claims, 5 Drawing Sheets

COVER STRUCTURE AND ELECTRONIC DEVICE USING THE SAME

BACKGROUND

1. Technical field

The present disclosure generally relates to a cover structure, particularly to a cover structure for an electronic device.

2. Description of Related Art

With the development of wireless communication and information processing technologies, portable electronic devices such as notebook computers, mobile phones, and personal digital assistants (PDAs) are now in widespread use. These electronic devices enable consumers to enjoy high technology services anytime and anywhere. Meanwhile, the electronic devices have more and more functions. For interconnecting and data transmitting with the other electronic devices, on an edge of the electronic devices usually define a power input interface, a microphone output interface, USB data interface and etc. If the interfaces are not protected, the electronic devices can suffer damage from water, dust and etc.

Therefore, a cover is detachably set on the interface of the electronic devices to protect against water or dust. The cover should be separated from the electronic devices when using the interface. Thus, the cover may be easily lost.

Therefore, there is room for improvement within the art.

BRIEF DESCRIPTION OF THE DRAWINGS

Many aspects of cover structure and electronic device using the same can be better understood with reference to the following drawing. The components in the drawing are not necessarily drawn to scale, the emphasis instead being placed upon clearly illustrating the principles of the method for cover structure. Moreover, in the drawing like reference numerals designate corresponding parts throughout the several views, in which.

DETAILED DESCRIPTION OF THE PREFERRED EMBODIMENTS

Figure 1:
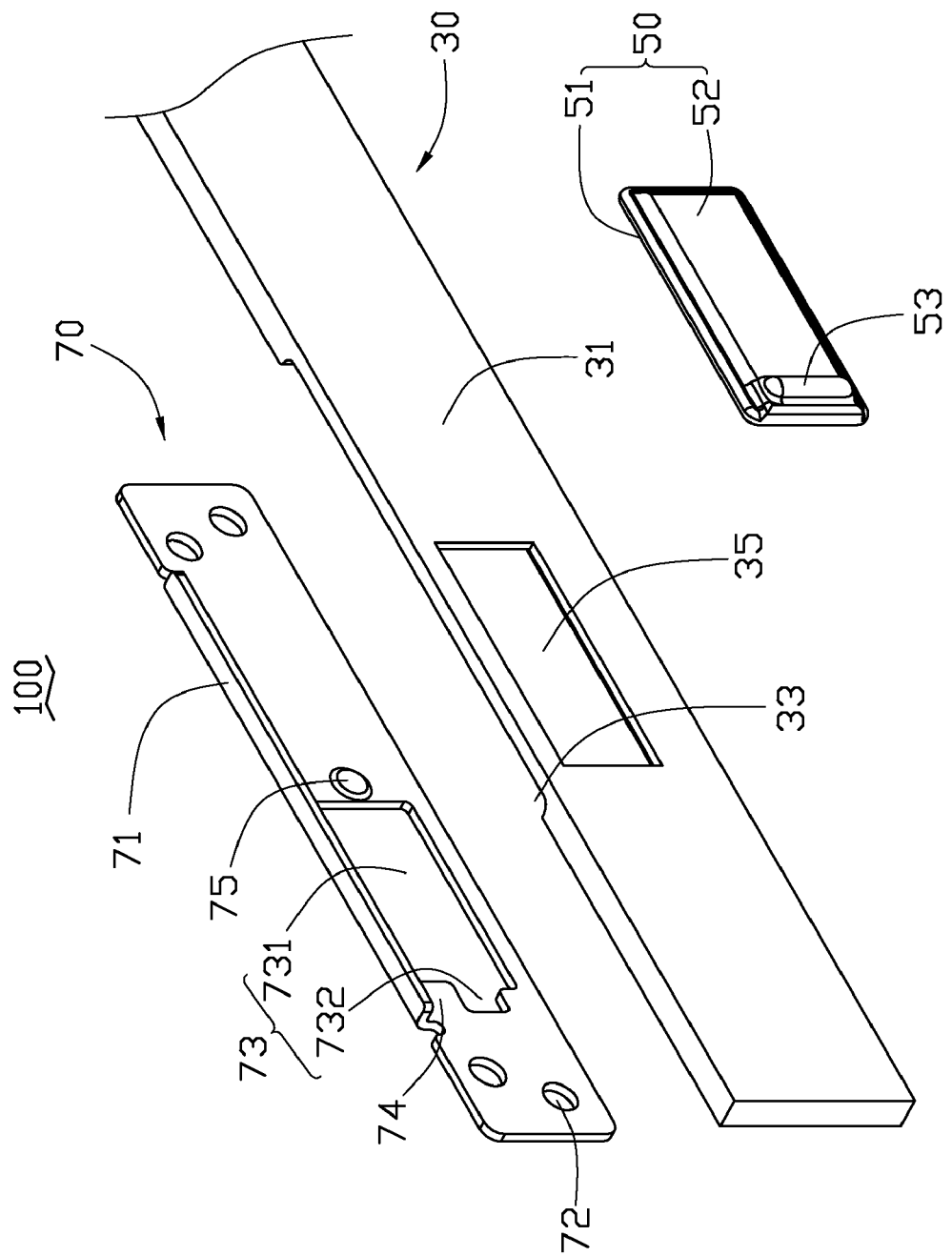
FIG. 1 is a schematic, exploded view of an exemplary embodiment of a cover structure.
Figure 2:
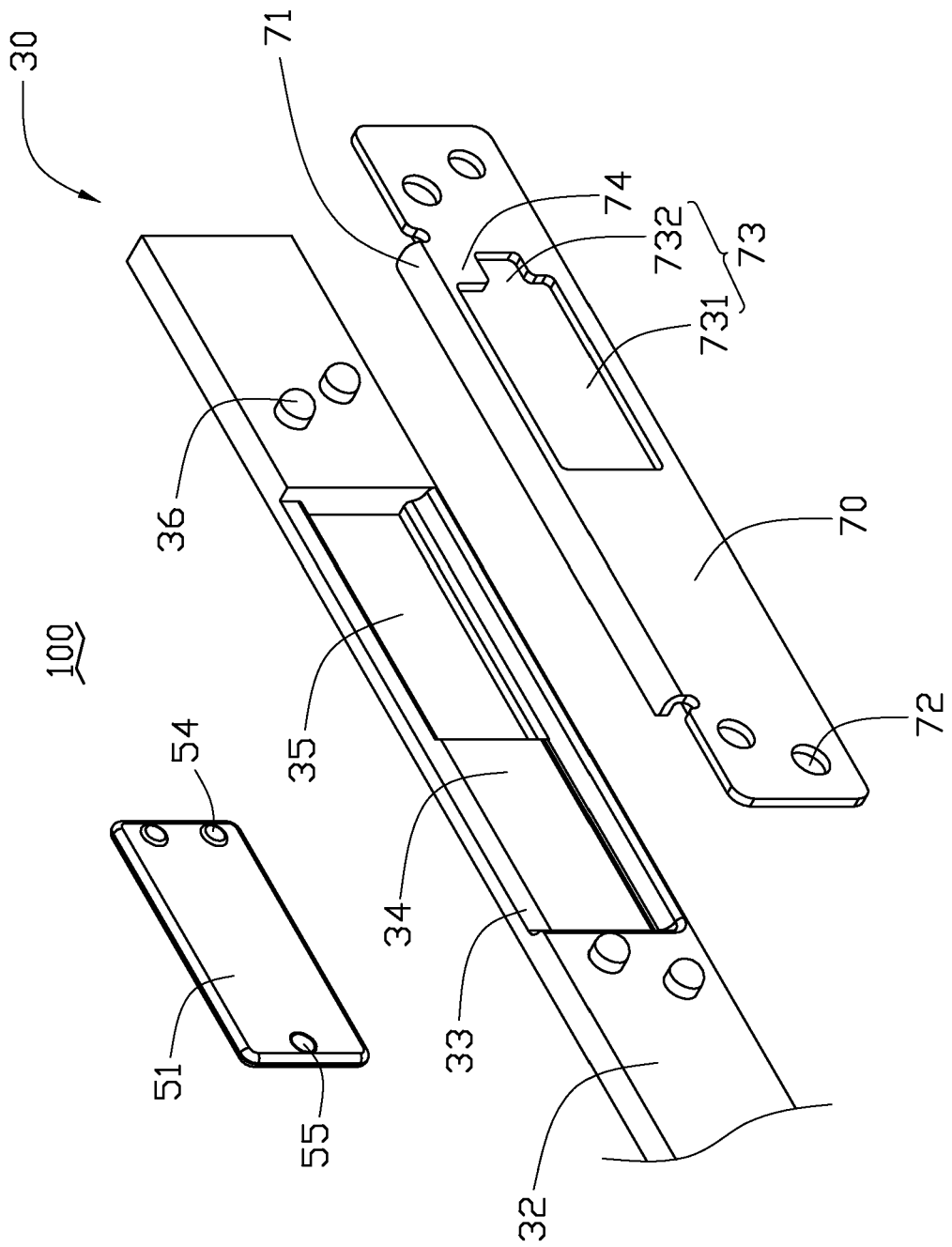
FIG. 2 is similar to FIG. 1 viewed from another angle.

Referring to FIGS. 1 and 2, in an exemplary embodiment, a cover structure 100 for an electronic device includes a substrate 30, a covering board 50 and an alignment plate 70 positioned on the substrate 30. The covering board 50 is positioned between the substrate 30 and the alignment plate 70. Furthermore, the covering board 50 is slidably latched relative to the substrate 30.

The substrate 30 is substantially rectangular including a top portion 31 and an opposite bottom portion 32. The substrate 30 can be made of rubber, soft plastic, etc. The bottom portion 32 defines a groove 33 communicating with an end of the substrate 30. A bottom of the groove 33 defines a sliding slot 34 and an opening 35 passing through the substrate 30. Positioning posts 36 are respectively positioned on two sides of the groove 33, and configured for positioning the alignment plate 70.

The covering board 50 also may be made of rubber, soft plastic, etc. The covering board 50 includes a main body 51 and a protruding portion 52 extending from the main body 51. The main body 51 is slightly larger than the opening 35, therefore, the main body 51 can be slidably set in the sliding slot 34, without slipping out of the opening 35. The protruding portion 52 can be received in the opening 35 and defines an opener 53. When the protruding portion 52 is received in the opening 35, the opener 53 extends from the opening 35 to allow convenient opening of the covering board 50. The main body 51 includes two protruding posts 54 and a receiving portion 55. Both the protruding posts 54 and the receiving portion 55 are set on the main body 51 positioned opposite to the protruding portion 52. The protruding posts 54 resist the alignment plate 70. The receiving portion 55 can mate with the alignment plate 70 to lock the covering board 50.

The alignment plate 70 is substantially rectangular and made of metal. An edgefold 71 extends from an end of the alignment plate 70. The edgefold 71 and the alignment plate 70 are at right-angle to each other. The edgefold 71 can resist the substrate 30, therefore, the alignment plate 70 and the substrate 30 define a fixed distance therebetween. Positioning holes 72 are respectively defined in two ends of the alignment plate 70. The positioning posts 36 can pass through the positioning holes 72 and fixed on the substrate 30 by hot melt or interference fit. The alignment plate 70 defines an aperture 73 having a first aperture portion 731 and a second aperture portion 732 communicating the first aperture portion 731. The first aperture portion 731 is larger than the second aperture portion 732. Therefore, the alignment plate 70 adjacent to two sides of the second aperture portion 732 forms a resisting portion 74. The protruding posts 54 can slide in the aperture 73 and respectively resist the resisting portion 74. The alignment plate 70 further defines a salient point 75 adjacent to the first aperture portion 731. When the covering board 50 slides in the sliding slot 34 and aligns with the aperture 73, the salient point 75 can be latched into the receiving portion 55 to lock the covering board 50.

Figure 3:
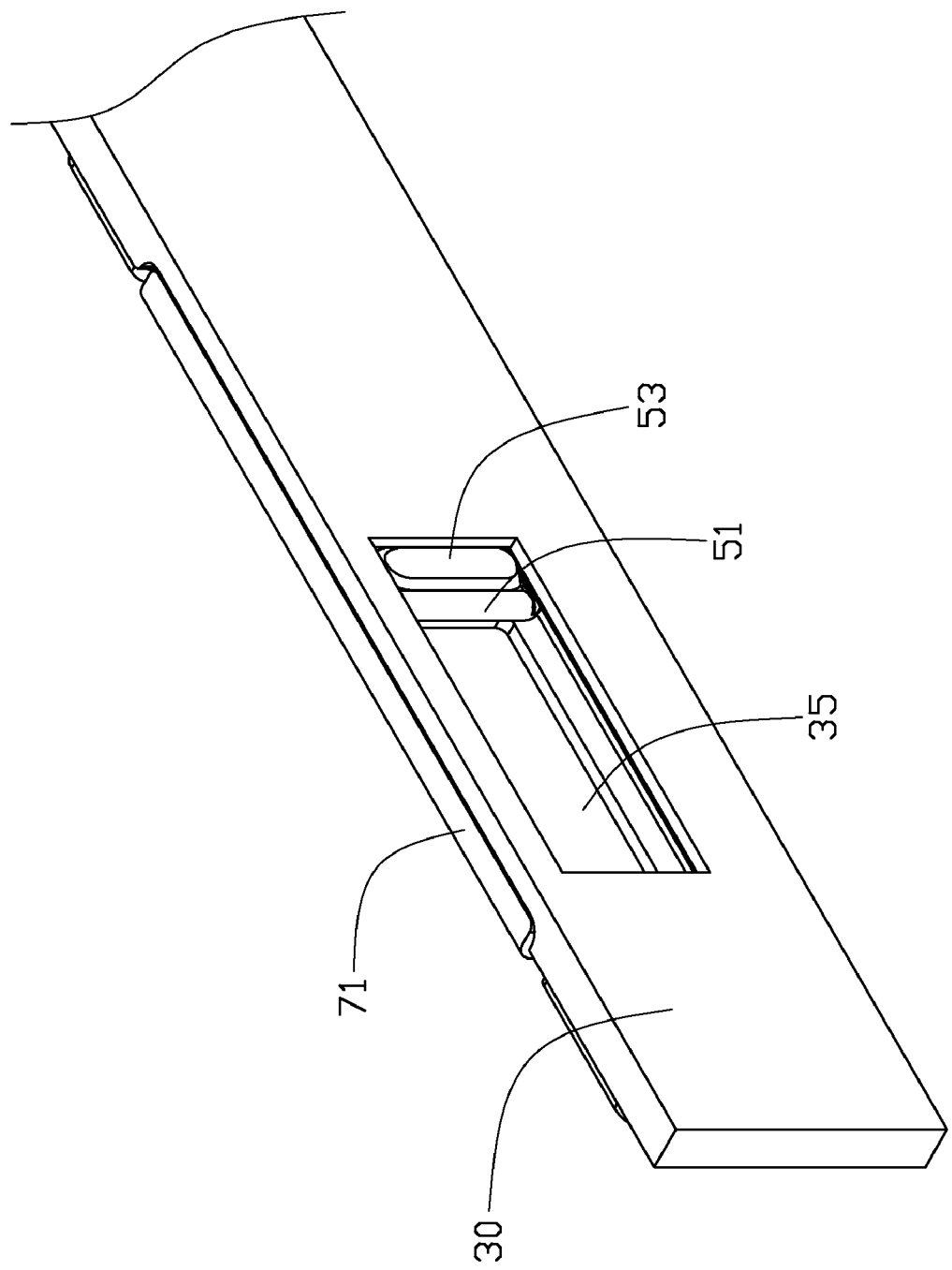
FIG. 3 is a schematic view of the cover structure in an opened state.

Referring to FIG. 3, in assembly, the covering board 50 is slidably set in the sliding slot 34. The alignment plate 70 is assembled on the positioning posts 36 by the positioning holes 72 fitting over the positioning posts 36 and the edgefold 71 resisting the substrate 30. Therefore, the covering board 50 is slidably set between the substrate 30 and the alignment plate 70.

When the cover structure 100 is opened, the opener 53 is forced to open the covering board 50. The receiving portion 55 escapes from the salient point 75. The protruding posts 54 slide to the aperture 73 from the resisting portion 74. The protruding portion 52 is separated from the opening 35. When the opener 53 resists the alignment plate 70 adjacent to an edge of the opening 35, the covering board 50 is completely opened.

Figure 4:
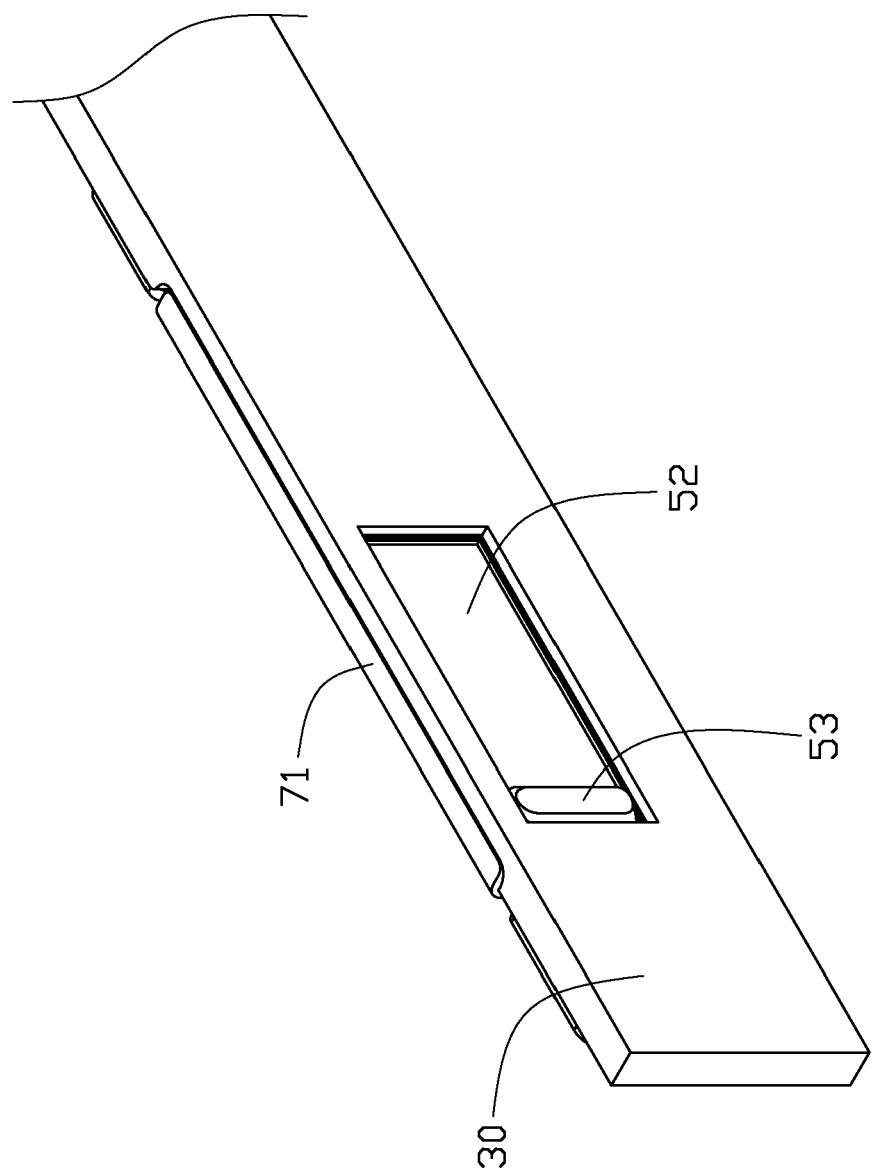
FIG. 4 is a schematic view of the cover structure in a closed state.

Referring to FIG. 4, when the cover structure 100 is closed, the opener 53 is forced to close the covering board 50. The covering board 50 slides in the sliding slot 34. The protruding posts 54 slide in the aperture 73. When the protruding posts 54 slide on the resisting portion 74, the resisting portion 74 resists the protruding posts 54 for pushing the covering board 50 toward the substrate 30. When the protruding portion 52 exposes out of the opening 35, the covering board 50 moves toward the substrate 30 to completely cover the opening 35. Meanwhile, the salient point 75 is received in the receiving portion 55 to fix the covering board 50 under completely closed condition.

Figure 5:
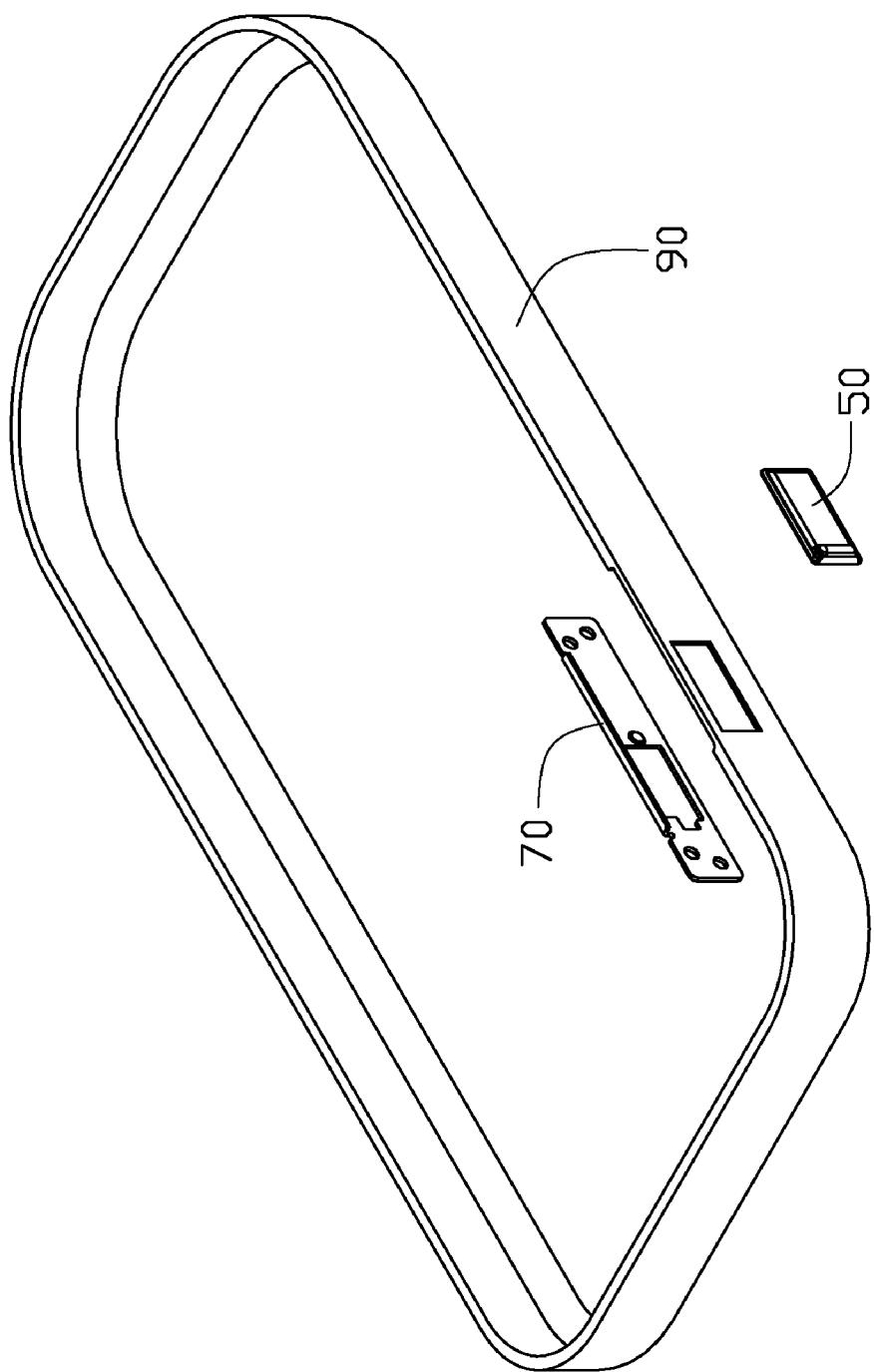
FIG. 5 is a schematic, exploded view of the cover structure used in an electronic device.

Referring to FIG. 5, it is to be understood that the substrate 30 can be taken as a housing 90, namely, the cover structure 100 is used in the electronic device.

It is to be understood that the groove 33 can be omitted. The sliding slot 34 is defined in the substrate 30.

It should be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A cover structure, comprising:
a substrate defining a sliding slot and an opening adjacent to the sliding slot;
a covering board comprising a receiving portion and two protruding posts;
an alignment plate defining a salient point, and an aperture at one side of the salient point, the aperture aligned with the opening, and two resisting portions positioned on the alignment plate at an opposite side of the aperture, the protruding posts sliding in the aperture and respectively resist the resisting portions;
wherein the alignment plate is fixed on the substrate, the covering board is positioned between the substrate and the alignment plate, the covering board slides in the sliding slot until the salient point is received in the receiving portion and the protruding posts resist the resisting portions to lock the covering board to the alignment plate.

2. The cover structure as claimed in claim 1, wherein an end of the alignment plate forms an edgefold for resisting the substrate, the edgefold and the substrate define a fixed distance for receiving the covering board.

3. The cover structure as claimed in claim 2, wherein the edgefold and the alignment plate are at a right-angle to each other.

4. The cover structure as claimed in claim 1, wherein the covering board further comprises a main body and a protruding portion positioned on the main body, the main body slidably set in the sliding slot, and the protruding portion is received in the opening.

5. The cover structure as claimed in claim 4, wherein the protruding portion defines an opener extending from the opening.

6. The cover structure as claimed in claim 1, wherein at least one positioning post respectively positions on two sides of the sliding slot, and at least one positioning hole is respectively defined in two ends of the alignment plate, the positioning post passes through the positioning hole and fixes the alignment plate to the substrate.

7. A cover structure, comprising:
a substrate defining an opening;
a covering board comprising a receiving portion and two protruding posts;
an alignment plate defining a salient point, an aperture at one side of the salient point, the aperture aligned with the opening, and two resisting portions positioned on the alignment plate at an opposite side of the aperture, the protruding posts sliding in the aperture and respectively resist the resisting portions;
wherein the alignment plate is fixed on the substrate, the covering board is assembled between the substrate and the alignment plate, the covering board slides in the sliding slot until the salient point is received in the receiving portion and the protruding posts resist the resisting portions to lock the covering board to the alignment plate.

8. The cover structure as claimed in claim 7, wherein the substrate comprises a sliding slot adjacent to the opening, the covering board is slidably positioned in the sliding slot.

9. The cover structure as claimed in claim 8, wherein an end of the alignment plate forms an edgefold for resisting the substrate, the edgefold and the substrate define a fixed distance for receiving the covering board.

10. The cover structure as claimed in claim 7, wherein the substrate has a plurality of positioning posts, the alignment plate defines a plurality of positioning holes relative to the positioning posts, the positioning posts pass through the positioning holes and fix the alignment plate to the substrate.

11. An electronic device, comprising:
a housing defining a sliding slot and an opening adjacent to the sliding slot;
a covering board comprising a receiving portion and two protruding posts;
an alignment plate defining a salient point, an aperture at one side of the salient point, the aperture aligned with the opening, and two resisting portions positioned on the alignment plate at an opposite side of the aperture, the protruding posts sliding in the aperture and respectively resist the resisting portions;
wherein the alignment plate is fixed on the housing, the covering board is positioned between the housing and the alignment plate, the covering board slides in the sliding slot until the salient point is received in the receiving portion and the protruding posts resist the resisting portions to lock the covering board to the alignment plate.

12. The electronic device as claimed in claim 11, wherein an end of the alignment plate forms an edgefold for resisting the housing, the edgefold and the substrate define a fixed distance for receiving the covering board.

* * * * *